(12) United States Patent
Park et al.

(10) Patent No.: US 6,881,659 B2
(45) Date of Patent: Apr. 19, 2005

(54) METHODS OF FORMING SELF-ALIGNED CONTACT STRUCTURES IN SEMICONDUCTOR INTEGRATED CIRCUIT DEVICES

(75) Inventors: Jong-Woo Park, Seoul (KR); Yun-Gi Kim, Kyunggi-do (KR); Dong-Gun Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 69 days.

(21) Appl. No.: 10/656,935

(22) Filed: Sep. 5, 2003

(65) Prior Publication Data

US 2004/0043542 A1 Mar. 4, 2004

Related U.S. Application Data

(62) Division of application No. 09/556,499, filed on Apr. 24, 2000, now Pat. No. 6,649,508.

(30) Foreign Application Priority Data

Feb. 3, 2000 (KR) .......................................... 2000-5358

(51) Int. Cl.$^7$ .......................................... H01L 21/4763
(52) U.S. Cl. .......................... 438/618; 438/6; 438/629; 438/637
(58) Field of Search .......................... 438/618, 6, 629, 438/637

(56) References Cited

U.S. PATENT DOCUMENTS

| | | | |
|---|---|---|---|
| 4,966,868 A | 10/1990 | Murali et al. ................ | 437/193 |
| 5,384,287 A | 1/1995 | Fukase ........................ | 437/228 |
| 5,500,080 A | 3/1996 | Choi ........................ | 156/644.1 |
| 5,502,336 A | 3/1996 | Park et al. ................... | 257/754 |
| 5,506,157 A | 4/1996 | Lee et al. ..................... | 437/31 |
| 5,567,989 A | 10/1996 | Sim ........................... | 257/774 |
| 5,591,670 A | 1/1997 | Park et al. ................... | 437/187 |
| 5,597,763 A | 1/1997 | Sim ........................... | 437/195 |
| 5,731,236 A | 3/1998 | Chou et al. .................. | 438/253 |
| 5,736,442 A * | 4/1998 | Mori ........................... | 438/257 |
| 5,766,992 A | 6/1998 | Chou et al. .................. | 438/241 |
| 5,897,372 A | 4/1999 | Howard ....................... | 438/637 |
| 5,920,763 A * | 7/1999 | Schuegraf ..................... | 438/3 |
| 6,160,317 A * | 12/2000 | Sun et al. .................... | 257/900 |
| 6,191,444 B1 * | 2/2001 | Clampitt et al. ............. | 257/315 |

(Continued)

*Primary Examiner*—Luan Thai
(74) *Attorney, Agent, or Firm*—Myers Bigel Sibley & Sajovec, PA

(57) ABSTRACT

Methods of forming integrated circuit devices (e.g., memory devices) include the use of preferred self-aligned contact hole fabrication steps. These steps improve process reliability by reducing the likelihood that contact holes will become misaligned to underlying integrated circuit device structures and thereby potentially expose the structures in an adverse manner. Typical methods include the steps of forming a plurality of interconnection patterns on a substrate and then covering a surface of the interconnection patterns and a portion of the substrate with a capping insulating layer such as silicon nitride layer. The capping insulating layer is then covered with an upper interlayer insulating layer different from the capping insulating layer. The upper interlayer insulating layer and the capping insulating layer are then dry-etched in sequence to form a first narrow contact hole that exposes the substrate, but preferably does not expose the interconnection patterns. The first contact hole is then widened in a self-aligned manner using the capping insulating layer as an etch-stop layer. This widening step is performed by wet etching sidewalls of the first contact hole using an etchant that etches the upper interlayer insulating layer faster than the capping insulating layer. In this manner, the first contact hole may be formed to initially compensate for potential misalignment errors and then a self-aligned wet etching step may be performed to widen the first contact hole into a second contact hole so that low resistance contacts (e.g., contact plugs) can be provided therein.

19 Claims, 5 Drawing Sheets

U.S. PATENT DOCUMENTS

| | | | |
|---|---|---|---|
| 6,214,739 B1 * | 4/2001 | Haung et al. | 438/709 |
| 6,218,689 B1 * | 4/2001 | Chang et al. | 257/288 |
| 6,221,714 B1 * | 4/2001 | Jang | 438/241 |
| 6,259,131 B1 * | 7/2001 | Sung et al. | 257/315 |
| 6,287,957 B1 * | 9/2001 | Linliu | 438/634 |
| 6,403,417 B1 * | 6/2002 | Chien et al. | 438/241 |
| 2001/0019866 A1 * | 2/2002 | Jang | 438/241 |

* cited by examiner

METHODS OF FORMING SELF-ALIGNED CONTACT STRUCTURES IN SEMICONDUCTOR INTEGRATED CIRCUIT DEVICES

RELATED APPLICATIONS

This application is a divisional of U.S. application Ser. No. 09/556,499, filed Apr. 24, 2000 now U.S. Pat. No. 6,649,508, which is related to Korean Application No. 2000-5358, filed Feb. 3, 2000, the disclosures of which are hereby incorporated herein by reference.

FIELD OF THE INVENTION

This invention relates to integrated circuit device fabrication methods and, more particularly, to methods of forming self-aligned contact structures in semiconductor integrated circuit devices.

BACKGROUND OF THE INVENTION

Attempts to increase device integration density in microelectronic integrated circuits have typically resulted in the fabrication of smaller and smaller devices that are spaced more closely together. In order to electrically access these devices, conventional techniques to photolithographically define the location of contact holes to these devices have also had to improve. Such improvements have typically included the development of photolithographic alignment techniques having reduced tolerances. Alternatively, attempts to reduce contact hole size may not represent an acceptable approach when forming highly integrated devices because reductions in contact hole size typically lead to substantial and unacceptable increases in contact resistance.

Techniques to reduce photolithographic alignment tolerances have typically not scaled at the same rate as techniques to scale the size of microelectronic devices. To address this limitation associated with photolithographic alignment, self-aligned contact hole fabrication techniques that are less dependent on photolithographic accuracy have been developed.

A method of forming self-aligned contact holes is taught in U.S. Pat. No. 5,897,372 to Howard entitled "Formation of a self-aligned integrated circuit structure using silicon-rich nitride as a protective layer". According to the U.S. Pat. No. 5,897,372, a gate electrode surrounded by an upper protection layer and a side-wall spacer is formed on a semiconductor substrate. A thin silicon-rich silicon nitride layer and a thick inter-layer insulating layer are sequentially formed on the entire surface of the resultant structure. The inter-layer insulating layer and the silicon-rich silicon nitride layer are dry-etched in sequence to form a self-aligned contact hole exposing the substrate between the gate electrodes. Here, a width of the self-aligned contact hole is wider than a space between the gate electrodes in order to maximize the exposed area of the substrate. Accordingly, an edge portion of the protection layer on the gate electrode is exposed by the self-aligned contact hole. At this time, in the event both the protection layer and the spacer are formed of a silicon oxide layer, the gate electrode may be exposed due to the over etching during a dry-etching process for forming the self-aligned contact hole. Thus, in order to overcome the above problem, both the protection layer and the spacer should be formed of silicon nitride layer having etch selectivity with respect to the inter-layer insulating layer or the thickness of the silicon-rich silicon nitride layer should be increased. However, the silicon nitride layer and the silicon-rich silicon nitride layer have higher dielectric constants than the silicon oxide layer. Therefore, the parasitic capacitance between the interconnection filling the self-aligned contact hole and the gate electrode is increased and such increase may degrade the electrical characteristics of the integrated circuit.

As a result, such self-aligned contact hole fabrication techniques may still be prone to reliability problems when photolithographic alignment techniques having relatively large alignment tolerances are used. Thus, notwithstanding such self-alignment techniques, there continues to be a need for improved methods of forming contact holes in highly integrated circuit substrates.

SUMMARY OF THE INVENTION

It is therefore an object of the present invention to provide methods of forming self-aligned contact structure, which can minimize the parasitic capacitance between two adjacent conductive layers and improve the reliability of the alignment techniques.

It is another object of the present invention to provide methods of forming self-aligned contact structure, which can minimize the contact resistance.

These and other objects, advantages and features of the present invention may be provided by methods of forming self-aligned contact structure of integrated circuit devices (e.g., memory devices). These methods improve process reliability by reducing the likelihood that contact holes will become misaligned to underlying integrated circuit device patterns and thereby potentially expose the patterns in an adverse manner. According to one embodiment of the present invention, a method of forming self-aligned contact structure includes the steps of forming a plurality of interconnection patterns on a substrate and then covering a surface of the interconnection patterns and a surface of the substrate with a capping insulating layer. The capping insulating layer is then covered with an upper inter-layer insulating layer filling gap regions between the interconnection patterns. The upper inter-layer insulating layer and the capping insulating layer are then dry-etched in sequence to form a narrow contact hole, e.g., a first contact hole that exposes the substrate, but preferably does not expose the interconnection patterns. In this embodiment, the capping insulating layer may be formed of silicon nitride layer. The first contact hole is then widened in a self-aligned manner using the capping insulating layer as an etch-stop layer. In particular, the first contact hole is widened to form a second contact hole exposing the capping insulating layer on the sidewalls of the interconnection patterns, by wet etching sidewalls of the first contact hole using an etchant that etches the upper inter-layer insulating layer faster than the capping insulating layer. In this manner, the first contact hole may be formed to initially compensate for potential misalignment errors and then a self-aligned wet etching step may be performed to widen the first contact hole so that low resistance contacts (e.g., contact plugs) can be provided in the second contact hole. During this widening step, the selectivity of the wet etchant can be made high to reduce the likelihood that the interconnection patterns will become exposed to the second contact hole.

According to another aspect of the present invention, the step of forming the second contact hole is preferably followed by the steps of forming an oxide spacer on a sidewall of the second contact hole and then etching a protrusion of the capping insulating layer extending opposite the substrate, using the oxide spacer as an etching mask. This latter sequence of steps is preferably performed in order to increase the area of the substrate that is exposed by the second contact hole and thereby lower the contact resistance between a subsequently formed contact plug and the substrate.

According to another embodiment of the present invention, a method of forming self-aligned contact structure of an integrated circuit memory device comprises the steps of forming a lower inter-layer insulating layer on a semiconductor substrate and then forming a pad contact hole in the lower inter-layer insulating layer. A pad plug is then formed in the pad contact hole using conventional techniques. First and second bit line patterns are then formed at adjacent locations on an upper surface of the lower interlayer insulating layer. A capping insulating layer that covers the pad plug and the first and second bit line patterns is then deposited. An upper interlayer insulating layer is then formed on the capping insulating layer. The upper interlayer insulating layer and the capping insulating layer are then etched in sequence to form a first contact hole that exposes a first portion of the underlying pad plug. The first contact hole is then widened in a preferred self-aligned manner by selectively etching the sidewalls of the first contact hole with an etchant that etches the upper interlayer insulating layer at a faster rate than the capping insulating layer, thereby forming a second contact hole exposing the capping insulating layer on the sidewalls of the bit line patterns. Next, an oxide spacer is formed on the sidewall of the second contact hole. After the oxide spacer has been formed, the capping insulating layer is again etched to expose a second portion of the pad plug that is greater than the first portion. This step is preferably performed using the oxide spacer as an etching mask. Alternatively, the oxide spacer may be formed with an etching process showing a poor etch selectivity respect to the capping insulating layer so that the capping insulating layer is etched concurrently with the formation of the oxide spacer. In this case, it is not required to additionally etch the capping insulating layer with an extra etching process. The second contact hole is then filled with a contact plug.

DESCRIPTION OF PREFERRED EMBODIMENTS

Figure 1:
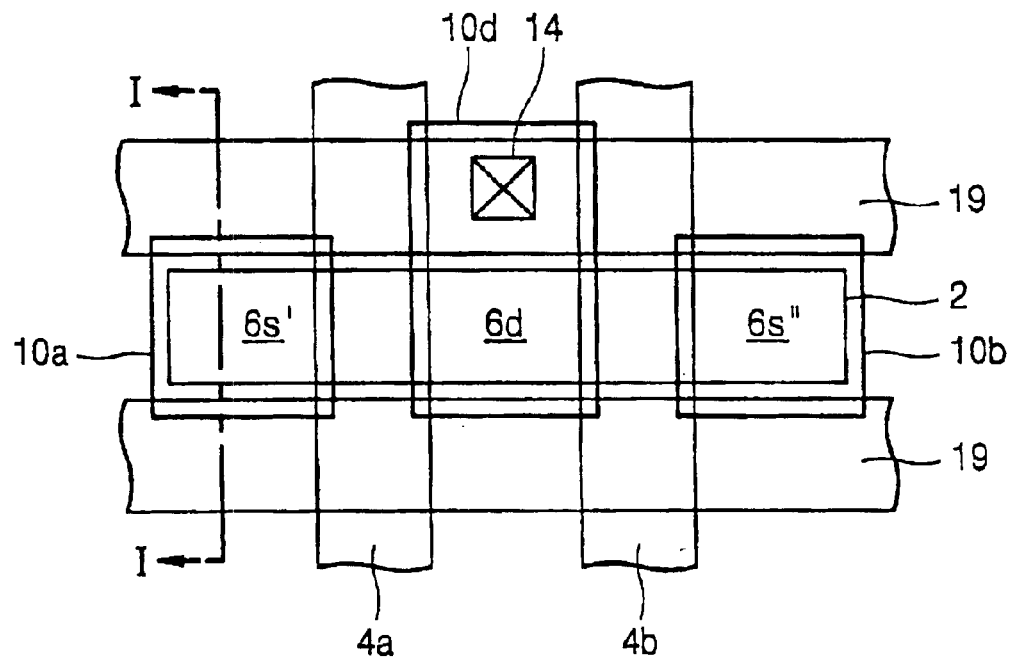
FIG. 1 is a top plan view showing a portion of a typical DRAM cell array region.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

FIG. 1 is a top plan view of a portion of a typical DRAM cell array region.

Referring to FIG. 1, an active region 2 is defined at a predetermined region of a P-type semiconductor substrate and a pair of word lines 4a and 4b run over the active region 2 in parallel. An isolation layer is formed at an outside region of the active region 2. The active region 2 between the pair of word lines 4a and 4b corresponds to a common drain region 6d doped with n-type impurities. The active regions 2 at both side of the common drain region 6d are a first source region 6s' and second source region 6s", respectively, A first storage node pad 10a, (e.g., a first pad plug) is disposed on the first source region 6s' and (the first storage node pad 10a) is electrically connected to the first source region 6s'. Similarly, a second storage node pad 10b, (e.g., a second pad plug) is disposed on the second source region 6s" and (the second storage node pad 10b) is electrically connected to the second source region 6s". Also, a bit line pad 10d is disposed on the common drain region 6d and is electrically connected to the common drain region 6d. The bit line pad 10d comprises a protrusion extended toward one side of the active region 2. First and second bit lines 19 are disposed across the pair of word lines 4a and 4b. The first bit line 19 is electrically connected to the bit line pad 10d through a bit line contact hole 14 exposing the protrusion of the bit line pad 10d. Like this, the second bit line 19 is electrically connected to another bit line pad (not shown).

Now, the present invention will be described in detail with the reference drawings (FIGS. 2 to 7).

Figure 2:
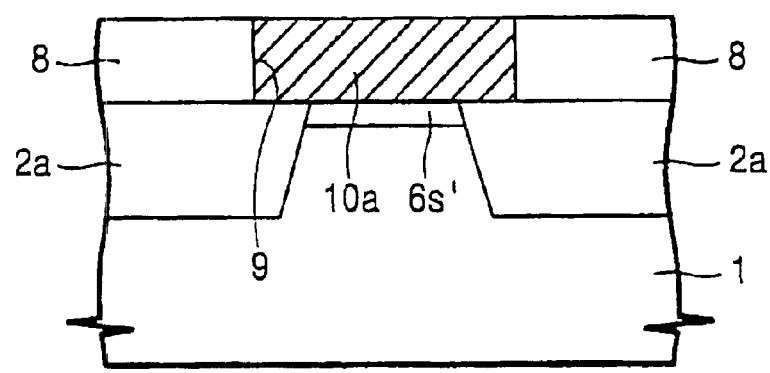
FIGS. 2–7 are cross-sectional views for illustrating preferred methods of forming self-aligned contact structure according to the present invention along the line I—I of the FIG. 1.

Referring to FIG. 2, preferred methods of forming integrated circuit devices with self-aligned contact holes include a step of forming an isolation layer 2a defining an active region (2 of FIG. 1) at a predetermined region of a P-type semiconductor substrate 1. The isolation layer 2a may be formed using conventional isolation techniques such as trench isolation processes or LOCOS (local oxidation of silicon) processes. A pair of word lines (4a and 4b of FIG. 1) are then formed across the active region. N-type impurities are implanted into the active region using the word lines as an ion implantation mask, thereby forming source/drain regions (6s', 6s" and 6d of FIG. 1). A lower inter-layer insulating layer 8 is formed on the entire surface of the resultant where the source/drain regions are formed. The lower inter-layer insulating layer 8 may be formed of silicon oxide layer such as borophosphosilicate glass (BPSG) layer, phosphosilicate glass (PSG) layer or undoped silicate glass (USG) layer.

A conventional photolithographically defined masking may then be performed to form a pad contact hole 9 in the lower interlayer insulating layer 8. This pad contact hole 9 exposes the source/drain regions. A blanket layer of polysilicon is then deposited on the lower interlayer insulating layer 8 and in the pad contact hole 9. This blanket layer of polysilicon may be a highly conductive polysilicon layer having N-type dopants therein. The blanket layer of polysilicon may then be planarized using the lower interlayer insulating layer 8 as a planarization stop layer. This planarization step results in the formation of a pad plugs (10a, 10b and 10d of FIG. 1) which act as highly conductive intermediate contacts to the underlying source/drain regions.

Figure 3:
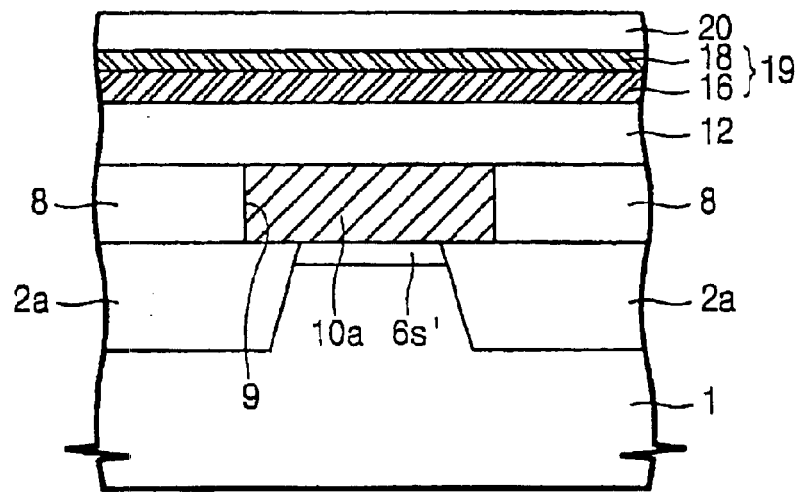

Referring to FIG. 3, an insulating layer 12 is formed on the lower interlayer insulating layer 8 and the pad plugs 10a, 10b and 10d. The insulating layer 12 may be formed of silicon oxide layer such as high temperature oxide (HTO) layer. The insulating layer 12 is patterned to form a bit line contact hole (14 of FIG. 1) exposing the bit line pad (10d of FIG. 1). A conductive layer 19 and a protection layer 20 are sequentially formed on the substrate having the bit line contact hole 14. The conductive layer 19 is preferably formed by sequentially stacking a polysilicon layer 16 and a metal silicide layer 18, and the protection layer 20 is preferably formed of a silicon oxide layer such as a HTO layer. The metal silicide layer 18 may be formed of refractory metal silicide layer such as tungsten silicide ($WSi_2$) layer and the protection layer 20 may be formed of a silicon nitride layer. The tungsten silicide ($WSi_2$) layer may be formed using a sputtering process.

Figure 4:
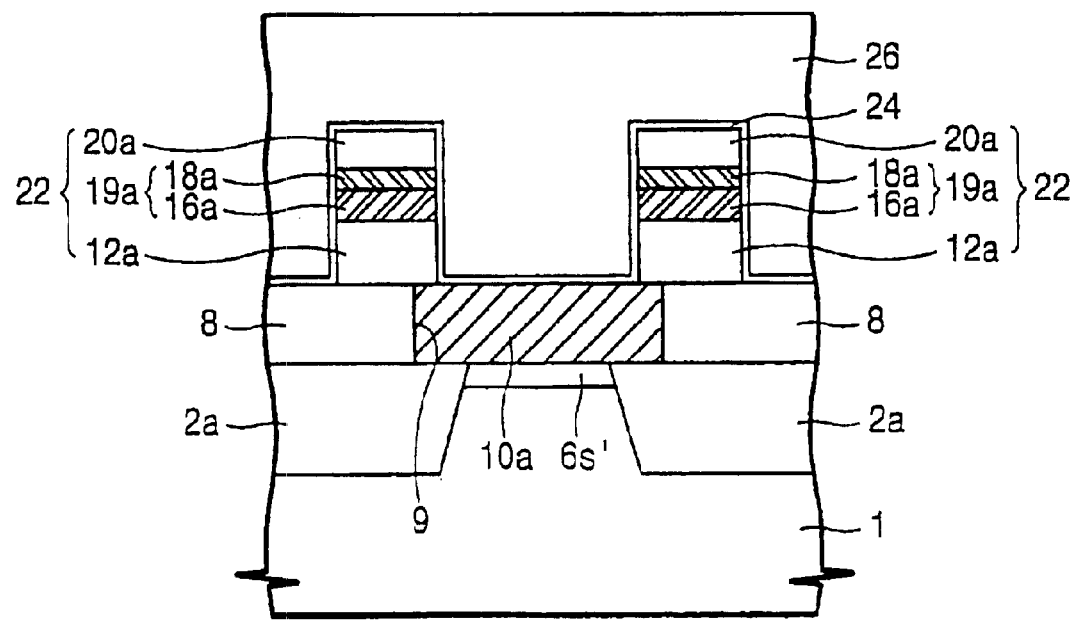

Referring now to FIG. 4, the protection layer 20, the conductive layer 19 and the insulating layer 12 is successively patterned using a photolithographic process to form a plurality of interconnection patterns, (e.g., a first and a second bit line patterns 22), covering the bit line contact holes 14 and expose a portion of the lower interlayer insulating layer 8 and the pad plugs 10a, 10b and 10d. These bit line patterns 22 may be formed as parallel stripes which extend in a third dimension (not shown). The respective bit line pattern 22 may comprise an insulating layer pattern 12a, bit line 19a and protection layer pattern 20a which are sequentially stacked. Here, the respective bit line 19a may comprise a polysilicon pattern 16a and a tungsten silicide pattern 18a which are sequentially stacked. As will be understood by those skilled in the art, the use of tungsten silicide as a bit line material lowers the per unit length resistance of each bit line 19a.

A blanket capping insulating layer 24 is then conformally deposited on the lower interlayer insulating layer 8, the pad plugs 10a, 10b, 10d and the bit line patterns 22, as illustrated. The capping insulating layer 24 is preferably formed of an insulating layer having a high wet etching selectivity with respect to an upper interlayer insulating layer to be formed in a subsequent process. In more detail, the capping insulating layer 24 is preferably formed of silicon nitride layer or silicon oxynitride (SiON) layer having a thickness of 50 to 100 A. A relatively thick upper interlayer insulating layer 26, filling gap regions between the bit line patterns 22, is then formed on the capping insulating layer 24. The upper interlayer insulating layer 26 may comprise a material selected from the group consisting of undoped silicate glass (USG), borophosphosilicate glass (BPSG), phosphosilicate glass (PSG) and high temperature oxide (HTO).

Figure 5A:
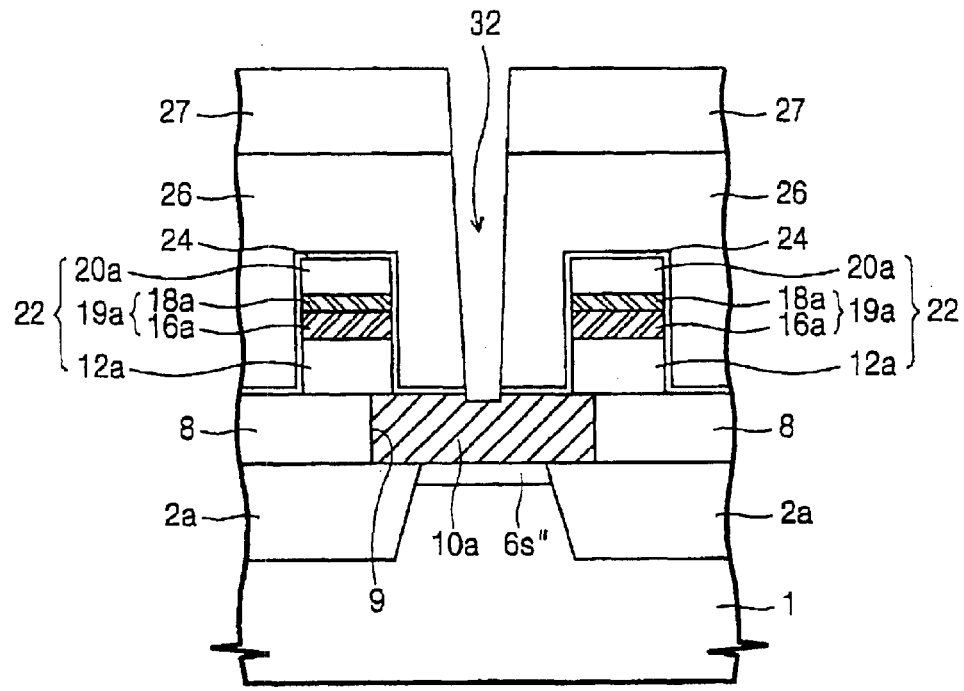

Referring to FIG. 5A, a photoresist pattern 27 is formed on the upper interlayer insulating layer 26 to selectively expose the upper interlayer insulating layer 26 above the first and second pad plugs (10a, 10b). Next, the exposed upper interlayer insulating layer 26 and the capping insulating layer 24 are dry-etched in sequence using the photoresist pattern 27 as an etching mask, thereby forming a relatively narrow and deep contact hole, (e.g., a first contact hole 32) exposing a first portion of the first pad plug 10a. At this time, another first contact hole is also formed on the second pad plug (10b of FIG. 1). It is preferable that the dry etching process for forming the first contact hole 32 is performed using a conventional oxide etch recipe showing a poor etching selectivity respect to silicon nitride layer. In more detail, the dry etching process for forming the first contact hole 32 may be performed with a oxide etch recipe using CF4 gas or CHF3 gas.

The first contact hole 32 is preferably formed as a narrow hole in order to reduce the likelihood that misalignment of the photoresist pattern 27 will cause the underlying bit line patterns 22 to become exposed during the dry etching step. Such exposure of the bit line patterns 22 can lead to electrical bridging and other parasitic faults that may reduce reliability and lifetimes of dynamic random access memory (DRAM) devices formed in the active region.

Figure 5B:
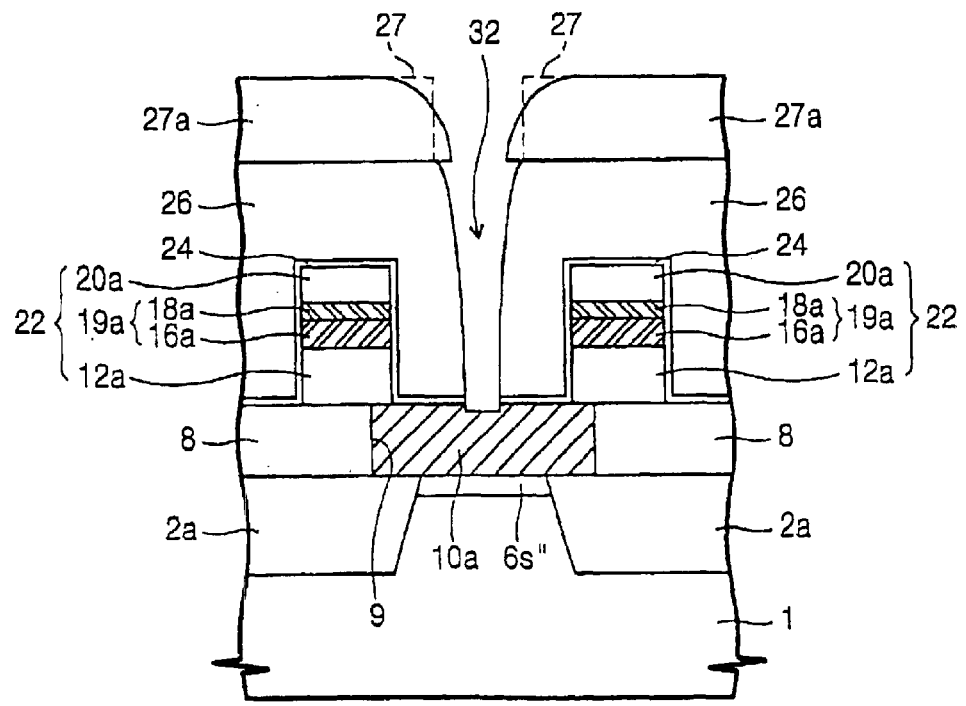

FIG. 5B is a cross sectional view for illustrating another method of forming a first narrow contact hole.

Referring to FIG. 5B, as described in FIG. 5A, the photoresist pattern 27 is formed on the upper interlayer insulating layer 26. The photoresist pattern 27 is then reflowed at a temperature of about 150 to 200° C. to form a flowed photoresist pattern 27a having a sloped sidewall. Accordingly, the exposed area of the upper interlayer insulating layer 26 is reduced. The exposed upper interlayer insulating layer 26 and the capping insulating layer 24 are dry-etched in sequence using the flowed photoresist pattern 27a as an etching mask to form a relatively narrow contact hole, e.g., a first narrow contact hole 32.

Figure 5C:
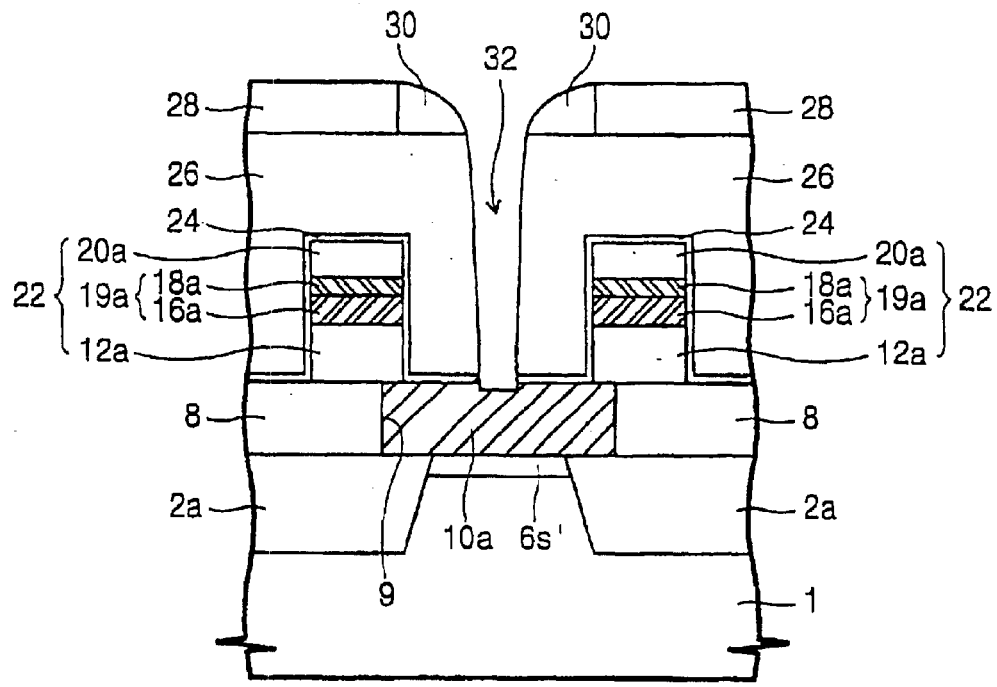

Alternatively, referring to FIG. 5C, in order to define the first narrow contact hole 32, a hard mask layer is formed on the upper interlayer insulating layer 26. The hard mask layer is preferably formed of a dense oxide layer such as high temperature oxide (HTO) layer. The hard mask layer is patterned using conventional techniques to form a mask pattern 28 having a preliminary contact hole therein exposing a predetermined region of the upper interlayer insulating layer 26. Conventional sidewall spacer technology is then used to form a mask spacer 30 on the sidewall of the mask pattern 28. The mask spacer 30 is preferably formed of the same material as the mask pattern 28.

The mask spacer 30 narrows the effective width of the preliminary contact hole and thereby reduces the likelihood that a subsequently performed etching step to expose the first and second pad plug 10a and 10b will result in the inadvertent exposure of the bit line patterns 22. In other words, the mask spacer 30 can be used advantageously to reduce the size of the preliminary contact hole and thereby increase process reliability in the event that photolithographic misalignment errors occur when the mask layer is patterned. Next, the upper interlayer insulating layer 26 and the capping layer 24 are dry-etched in sequence using the mask pattern 28 and the mask spacer 30 as etching masks and thereby form a first narrow contact hole 32 exposing first portions of the first and second pad plugs 10a and 10b. At this time, the mask pattern 28 and the mask spacer 30 are also etched. Therefore, the mask pattern 28 and the mask spacer 30 may be removed during formation of the first contact hole 32.

Figure 6:
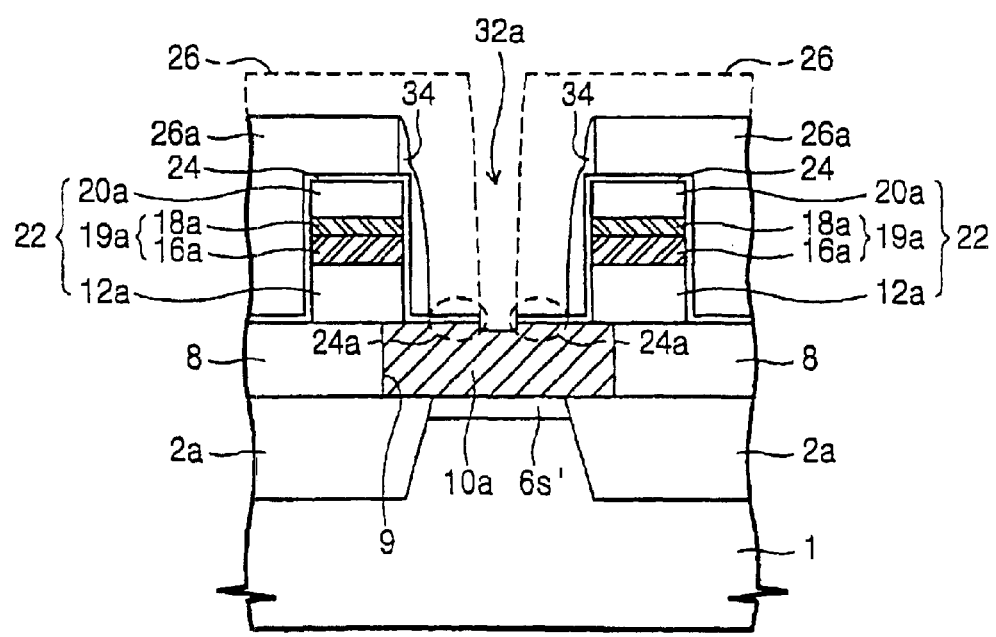

Referring now to FIG. 6, after removing the photoresist pattern 27 of FIG. 5A or the reflowed photoresist pattern 27a of FIG. 5B, a wet etching step is performed to widen the first contact hole 32 in a self-aligned manner and thereby form a second contact hole 32a. At this time, the upper interlayer insulating layer 26 is isotropically etched so that the upper surface thereof is lowered. Thus, an upper interlayer insulating layer 26a having a reduced thickness is formed. It is preferable that the wet etching step is performed until the capping insulating layer 24 on the sidewalls of the bit line patterns 22 is exposed. In particular, the wet etching step is preferably performed using an etchant that selectively etches the upper interlayer insulating layer 26 at a significantly faster rate than the capping insulating layer 24. In the event the capping insulating layer 24 and the upper interlayer insulating layer 26 are formed of silicon nitride and silicon oxide, respectively, hydrofluoric acid (HF) or buffered oxide etchant (BOE) is preferable used as the wet etchant.

During this wet etching step, the capping insulating layer 24 is used as an etch stop layer (i.e., a protective layer for the sidewalls of the bit line patterns 22). By using the capping insulating layer 24 as an etch stop layer, the second contact hole 32a can be formed in a self-aligned manner (with respect to the bit line patterns 22) even if some misalignment of the first contact hole 32 is present. Subsequently, an oxide spacer 34 having a width of about 500A is formed on a sidewall of the second contact hole 32a in a conventional manner. At this time, a portion of the capping insulating layer 24 (i.e. a protrusion 24a) may be exposed on the bottom of the second contact hole 32a. The oxide spacer 34 is preferably formed of insulating layer having a low dielectric constant, for example, a silicon oxide layer such as high temperature oxide (HTO). The width of the oxide spacer 34 can be determined appropriately according to a width of the second contact hole 32a.

Figure 7:
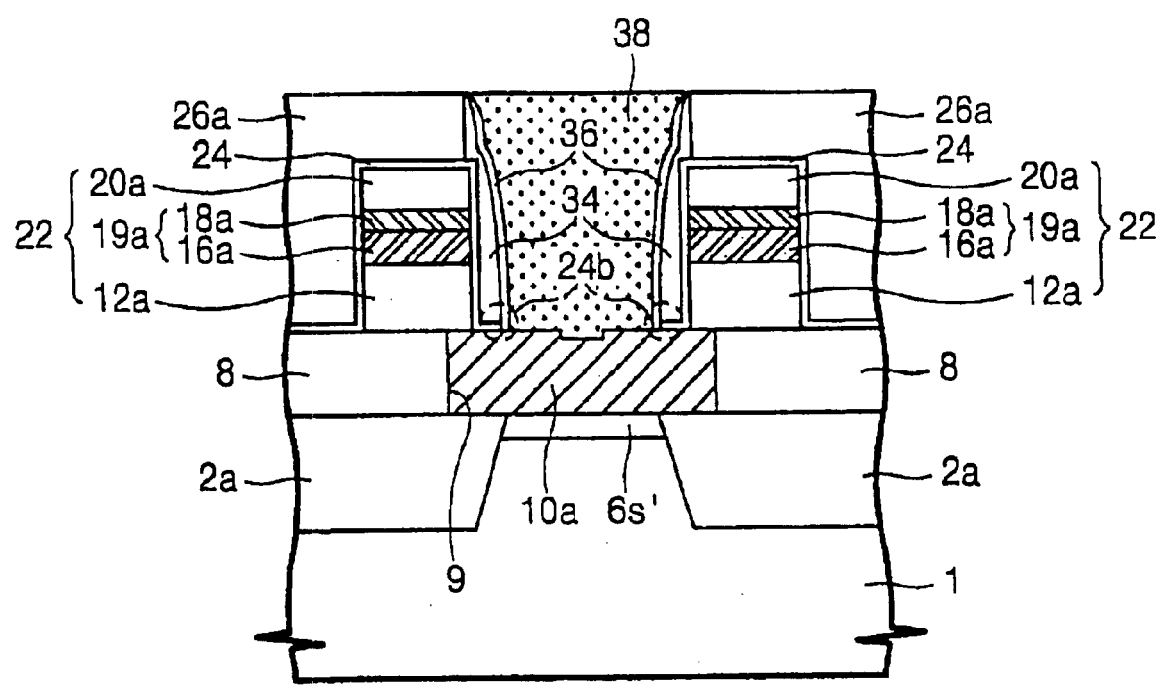

Referring to FIG. 7, the protrusion 24a of the capping insulating layer 24 is dry-etched to expose a second portion greater than the first portion of the pad plugs 10a and 10b. In case the oxide spacer 34 is formed using the etching recipe described in FIGS. 5A to 5C (i.e., the etching recipe for forming the first contact hole 32), the protrusion 24a of the capping insulating layer 24 may be easily removed without applying any additive etching process. Thus, the step of forming the oxide spacer 34 and the step of etching the protrusion 24a can be performed with in-situ process using one etching recipe. As a result, an extension 24b of the capping insulating layer 24 exists under the oxide spacer 34.

Meanwhile, according to the above mentioned, even if the pad plugs 10a and 10b are not exposed completely during the formation of the first contact hole 32, the second contact hole 32a exposing the second portions of the pad plugs 10a and 10b can be formed. This is because the capping insulating layer 24 on the bottom of the second contact hole 32a may be completely exposed during the wet etch process for forming the second contact hole 32a and the exposed capping insulating layer 24 can be easily removed during the step of forming the oxide spacer 34. As a result, process margin of the etch step for forming the first contact hole 32 can be increased.

In addition, an etch stop spacer 36 may further formed on the inner sidewall of the oxide spacer 34. In more detail, a thin etch stop layer having a thickness of 50 to 100A is conformally formed on the entire surface of the structure of FIG. 6, and the etch stop layer is anisotropically etched to form the etch stop spacer 36. The etch stop layer is preferably formed of an insulating layer having a high etch selectivity respect to the oxide wet etchant, for example, silicon nitride or silicon oxynitride. Alternatively, the protrusion 24a may be etched in sequence after formation of the etch stop spacer 34.

A conductive layer such as doped polysilicon layer is then formed on the entire surface of the etch stop spacer 36. Here, a wet cleaning process may be performed in order to remove a native oxide layer and/or contaminants on the exposed pad plugs 10a and 10b prior to formation of the conductive layer filling the second contact hole 32a. The wet cleaning process is typically performed using a mixture of ammonia hydroxide (NH4OH), hydro-peroxide (H2O2) and de-ionized water, and buffered oxide etchant (BOE). At this time, the etch stop spacer 36 which may be formed of silicon nitride or silicon oxynitride shows high etch selectivity respect to the wet cleaning solutions. Thus, the oxide spacer 34 is safely protected by the etch stop spacer 36.

Next, the conductive layer is etched-back until the upper surface of the upper interlayer insulating layer 26a is exposed, to thereby form a contact plug 38 in the second contact hole 32a.

Referring still to FIG. 7, the capping insulating layer 24, the oxide spacer 34 and the etch stop spacer 36 are interposed between the contact plug 38 and the bit line patterns 22. Here, even if the capping insulating layer 24 and the etch stop spacer 36 are formed of a very thin silicon nitride or silicon oxynitride having a thickness of 50 to 100A, a self-aligned contact hole can be formed without damaging the bit line patterns 22. Accordingly, it is possible to remarkably reduce a parasitic capacitance between the contact plug 38 and the bit lines 19a by forming the oxide spacer 34 having an adequate width therebetween. Also, it is easy to reduce a contact resistance between the contact plug 38 and the pad plugs 10a and 10b by maximizing the contact area therebetween.

As described above, methods of the present invention can be used to prevent bit lines from being exposed by self-aligned contact holes. Also, it can improve the alignment margin of the photolithography process for forming the first contact hole. Therefore, it can realize the reliable self-aligned contact structure. In addition, it can reduce the parasitic capacitance between the contact plug and the bit lines by forming the reliable oxide spacer therebetween.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit device, comprising the steps of:
   forming a microelectronic structure on a substrate;
   covering a sidewall of the microelectronic structure and a portion of the substrate with a first electrically insulating layer comprising a first material; then
   covering the microelectronic structure and the first electrically insulating layer with a second electrically insulating layer comprising a second material different from the first material;
   etching the second electrically insulating layer and the first electrically insulating layer in sequence to define a contact hole therein that exposes the substrate; and
   widening the contact hole to expose the first electrically insulating layer by wet etching sidewalls of the contact hole using an etchant that etches the second material faster than the first material.

2. The method of claim 1, wherein said widening step is followed by the steps of:
   forming a sidewall insulating spacer on a sidewall of the contact hole; and then
   etching a portion of the first electrically insulating layer extending opposite the substrate, using the sidewall insulating spacer as an etching mask.

3. The method of claim 2, wherein the substrate comprises a polysilicon conductive plug therein; and wherein said step of etching the second electrically insulating layer and the first electrically insulating layer in sequence comprises etching the first electrically insulating layer to expose the conductive plug.

4. The method of claim 3, wherein the first electrically insulating layer comprises silicon nitride; and wherein the second electrically insulating layer comprises silicon dioxide.

5. The method of claim 3, wherein said dry etching step comprises dry etching the second electrically insulating and the first electrically insulating layer in sequence to expose the conductive plug.

6. The method of claim 1, wherein said step of etching the second electrically insulating layer and the first electrically insulating layer in sequence comprises dry etching the second electrically insulating and the first electrically insulating layer in sequence.

7. A method of forming an integrated circuit memory device, comprising the steps of:
   forming an electrically conductive bit line on a substrate having a first conductive plug therein extending to a surface thereof;
   covering the bit line and the first conductive plug with a silicon nitride capping layer; then
   covering the bit line and the silicon nitride capping layer with an electrically insulating oxide layer;
   dry etching the electrically insulating oxide layer and the silicon nitride capping layer in sequence to define a contact hole therein that exposes the first conductive plug at the surface; and
   widening the contact hole to expose the silicon nitride capping layer by wet etching sidewalls of the contact hole using an etchant that etches the electrically insulating oxide layer at a faster rate than the silicon nitride capping layer.

8. The method of claim 7, wherein said widening step is followed by the steps of:
   forming an oxide spacer on a sidewall of the contact hole; and then
   wet etching a portion of the silicon nitride capping extending opposite the first conductive plug, using the oxide as an etching mask.

9. The method of claim 8, wherein said step of wet etching a portion of the silicon nitride capping layer is followed by the step of forming a second conductive plug that extends in the contact hole and ohmically contacts the first conductive plug.

10. The method of claim 9, wherein said step of forming an electrically conductive bit line comprises forming an electrically conductive bit line as a composite of a polysilicon conductive layer and a tungsten silicide layer on an upper surface of the polysilicon conductive layer.

11. The method of claim 7, wherein said step of forming an electrically conductive bit line comprises forming an electrically conductive bit line as a composite of a polysilicon conductive layer and a tungsten silicide layer on an upper surface of the polysilicon conductive layer.

12. A method of forming an integrated circuit memory device, comprising the steps of:
   forming a first interlayer insulating layer on a semiconductor substrate;
   forming a first contact hole in the first interlayer insulating layer;
   forming a first conductive plug in the first contact hole;
   forming first and second bit lines at adjacent locations on an upper surface of the first interlayer insulating layer;
   forming a capping layer that covers the first conductive plug and the first and second bit lines;
   forming a second interlayer insulating layer on the capping layer;
   etching the second interlayer insulating layer and the capping layer in sequence to define a second contact hole that exposes a first portion of the first conductive plug;
   widening the second contact hole by selectively etching the sidewalls of the second contact hole with an etchant that etches the second interlayer insulating layer at a faster rate than the capping layer; then
   forming a sidewall spacer on the sidewall of the second contact hole; and
   etching the capping layer to expose a second portion of the first conductive plug that is greater than the first portion, using the sidewall spacer as an etching mask.

13. The method of claim 12, wherein the first and second interlayer insulating layers comprise silicon dioxide; and wherein the capping layer comprises silicon nitride.

14. The method of claim 12, wherein said step of etching the second interlayer insulating layer is preceded by the steps of:
   forming a masking layer having a pilot hole therein, on the second interlayer insulating layer; and
   narrowing the pilot hole by forming a pilot hole spacer on a sidewall of the first pilot hole.

15. The method of claim 14, wherein said step of etching the second interlayer insulating layer comprises dry etching the second interlayer insulating layer through the narrowed pilot hole.

16. The method of claim 15, wherein the second interlayer insulating layer comprises a material selected from the group consisting of undoped silicate glass (USG), borophosphosilicate glass (BPSG), phosphosilicate glass (PSG) and high temperature oxide (HTO).

17. The method of claim 16, wherein the capping layer comprises a material selected from the group consisting of silicon nitride, nitrided oxide and oxynitride.

18. The method of claim 12, wherein the second interlayer insulating layer comprises a material selected from the group consisting of undoped silicate glass (USG), borophosphosilicate glass (BPSG), phosphosilicate glass (PSG) and high temperature oxide (HTO).

19. The method of claim 18, wherein the capping layer comprises a material selected from the group consisting of silicon nitride, nitride oxide and oxynitride.

* * * * *